(12) United States Patent
Lim et al.

(10) Patent No.: US 11,556,157 B2
(45) Date of Patent: Jan. 17, 2023

(54) DIAGONAL PRINTED CIRCUIT BOARDS SYSTEMS

(71) Applicant: Intel Corporation, Santa Clara, CA (US)

(72) Inventors: Min Suet Lim, Gelugor Pulau Pinang (MY); Chee Chun Yee, Bayan Lepas Pulau Pinang (MY); Yew San Lim, Gelugor Pulau Pinang (MY); Jeff Ku, Taipei (TW); Tin Poay Chuah, Payan Baru Pulau Pinang (MY)

(73) Assignee: INTEL CORPORATION, Santa Clara, CA (US)

( * ) Notice: Subject to any disclaimer, the term of this patent is extended or adjusted under 35 U.S.C. 154(b) by 126 days.

(21) Appl. No.: 17/089,752

(22) Filed: Nov. 5, 2020

(65) Prior Publication Data
US 2022/0075410 A1    Mar. 10, 2022

(30) Foreign Application Priority Data
Sep. 4, 2020    (MY) ............................ PI2020004597

(51) Int. Cl.
*G06F 1/20* (2006.01)
*H05K 7/20* (2006.01)
*G06F 1/16* (2006.01)

(52) U.S. Cl.
CPC .............. *G06F 1/206* (2013.01); *G06F 1/203* (2013.01); *H05K 7/2039* (2013.01); *G06F 1/1616* (2013.01); *G06F 1/1662* (2013.01)

(58) Field of Classification Search
CPC .......... G06F 1/183; G06F 1/184; G06F 1/203; G06F 1/206; H05K 7/2039
See application file for complete search history.

(56) References Cited

U.S. PATENT DOCUMENTS

| | | | | |
|---|---|---|---|---|
| 6,094,347 A  * | 7/2000 | Bhatia | ..................... | G06F 1/203 361/679.55 |
| 6,125,035 A  * | 9/2000 | Hood, III | ............ | F28D 15/0275 361/679.55 |
| 6,407,921 B1 * | 6/2002 | Nakamura | ............ | H01L 23/427 361/698 |
| 7,035,111 B1 * | 4/2006 | Lin | ......................... | G06F 1/184 361/748 |
| 2006/0082966 A1* | 4/2006 | Lev | ......................... | G06F 1/203 361/679.48 |
| 2013/0107477 A1* | 5/2013 | Chen | ..................... | G06F 1/1616 361/752 |
| 2013/0327507 A1* | 12/2013 | Degner | ................. | H05K 7/2039 361/695 |

* cited by examiner

*Primary Examiner* — Nidhi Thaker
(74) *Attorney, Agent, or Firm* — Viering, Jentschura & PartnerMBB

(57) ABSTRACT

According to the present disclosure, a laptop may be provided with a smaller z-height using a motherboard assembly, including a motherboard having a plurality of components coupled thereon, a thermal transfer unit coupled to one or more component on the motherboard and attachment members for holding the motherboard in a lower compartment of a laptop clamshell casing at an inclining position.

15 Claims, 9 Drawing Sheets

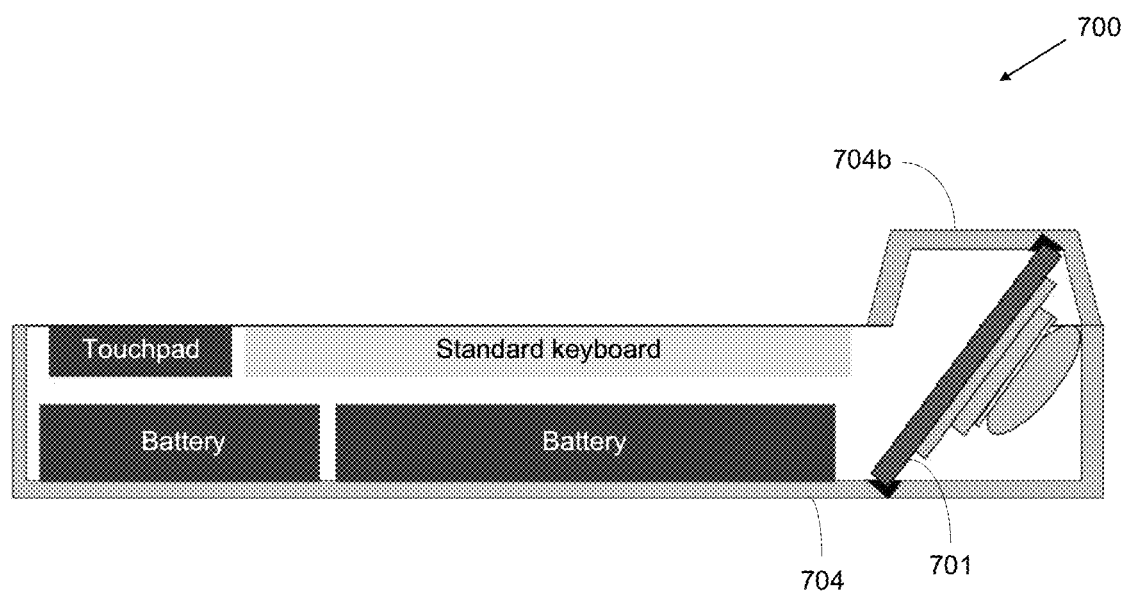
FIG. 7
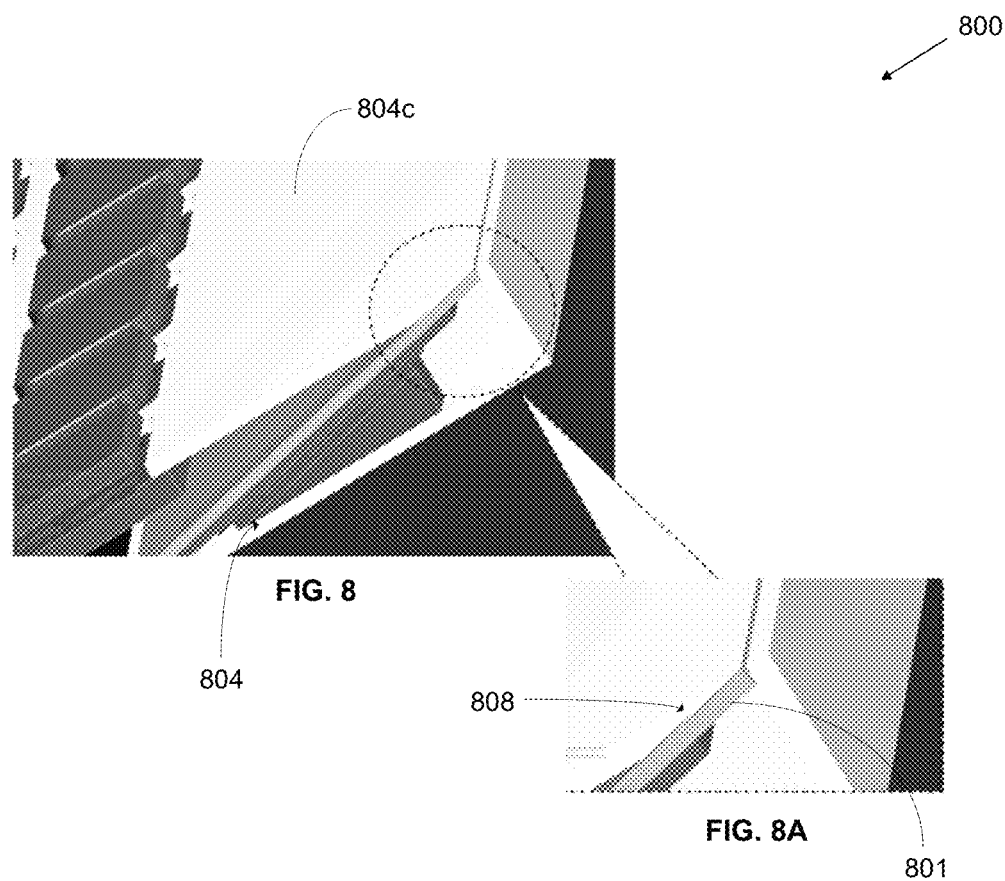
FIG. 8
FIG. 8A

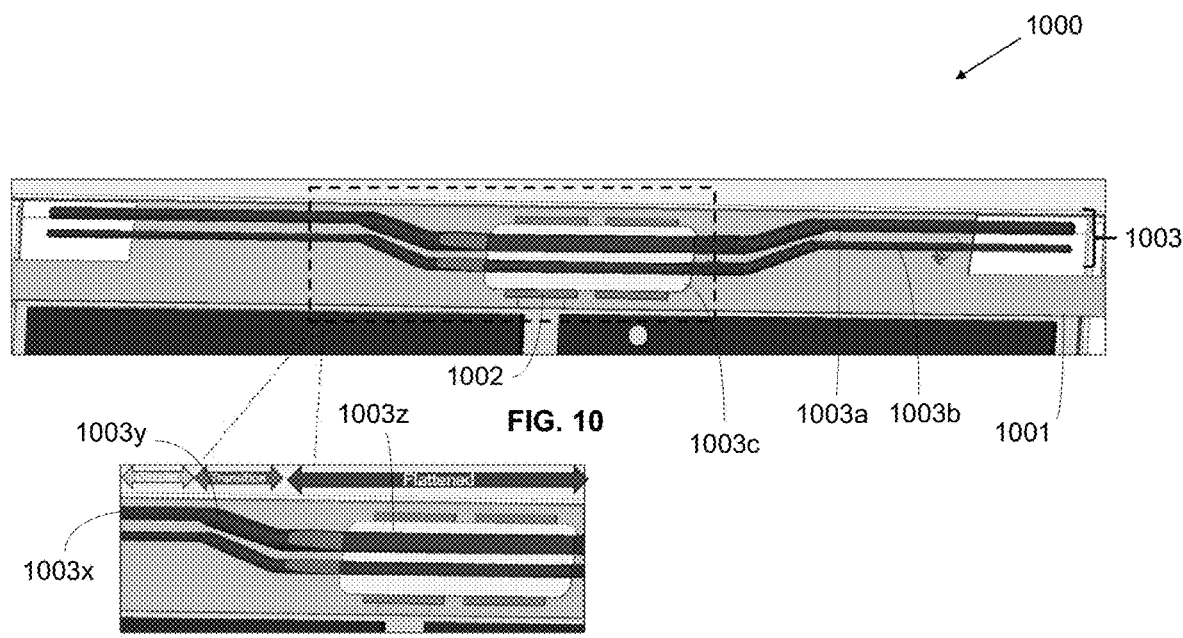
FIG. 10
FIG. 10A
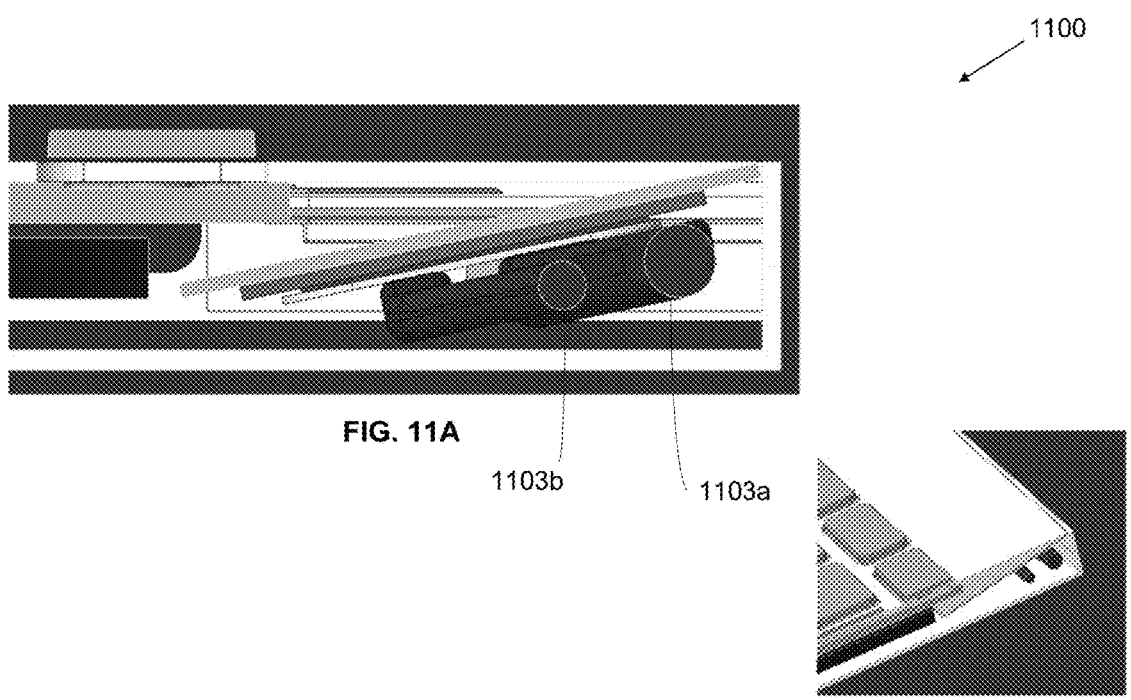
FIG. 11A
FIG. 11B

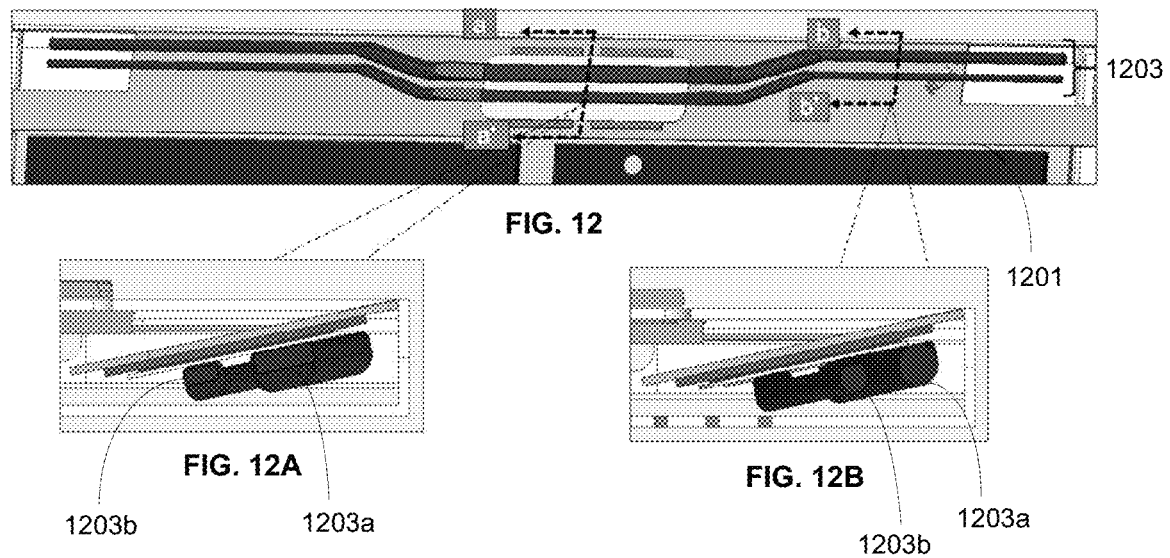
FIG. 12
FIG. 12A
FIG. 12B
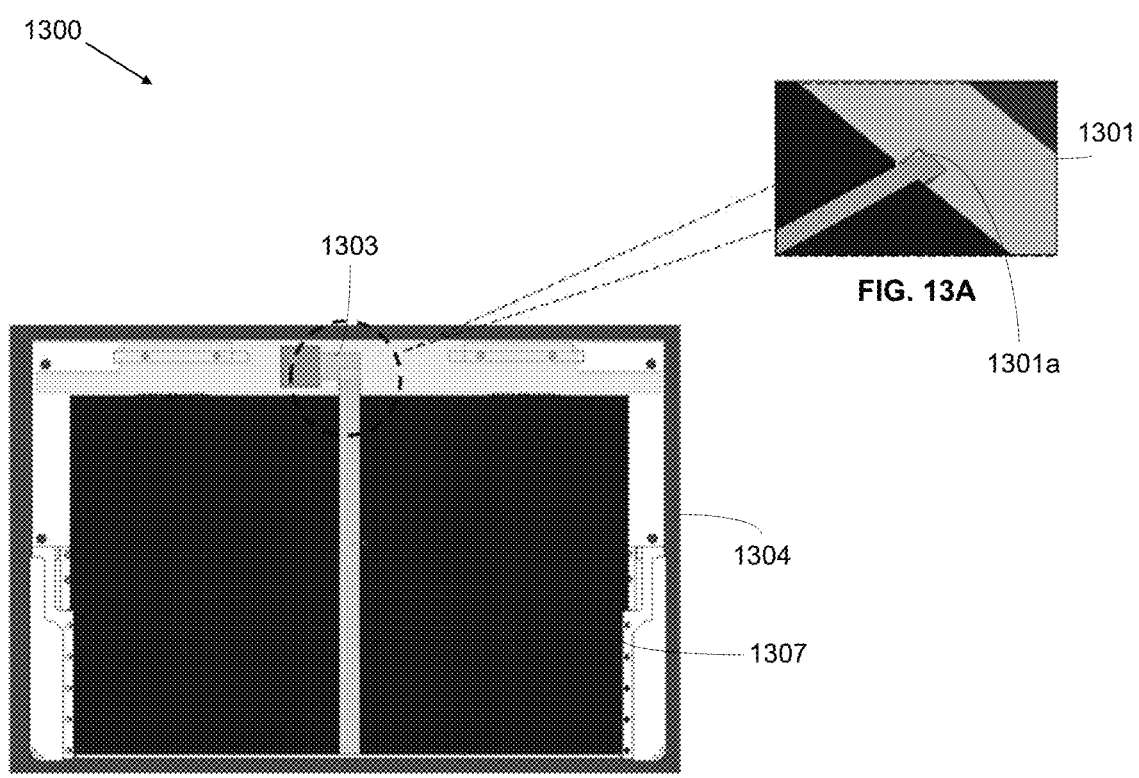
FIG. 13
FIG. 13A

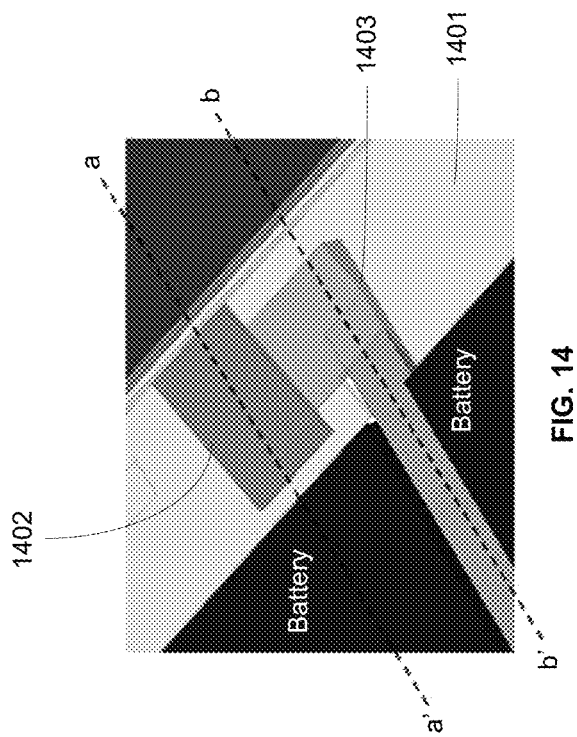
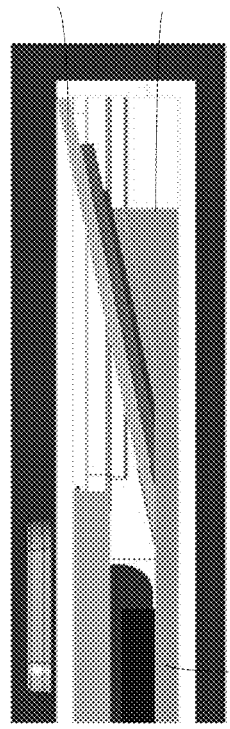
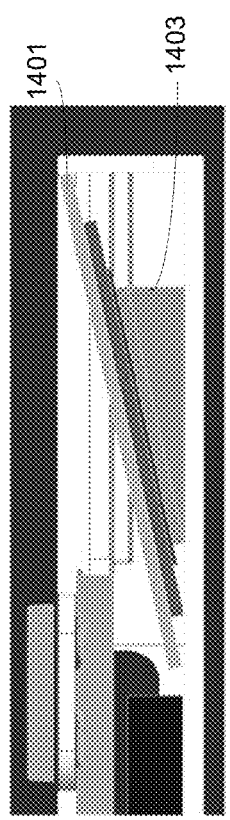
FIG. 14
FIG. 14A
FIG. 14B

DIAGONAL PRINTED CIRCUIT BOARDS SYSTEMS

CROSS-REFERENCE TO RELATED APPLICATIONS

This non-provisional application claims priority to Malaysian Patent Application No. P12020004597, which was filed on Sep. 4, 2020, which is incorporated by reference herein in its entirety.

BACKGROUND

For high-end, premium laptop computers, the clamshell profile and the weight are of paramount importance. Typically, a lower compartment for a premium clamshell system may have a thickness in the range of 6 to 8 mm, with an overall thickness for the clamshell in the range of 9 to 12 mm. The present limitation in the thickness, i.e., z-direction, may be due to the laptop's motherboard overlapping with the keyboard. Many laptop users prefer to have a standard size keyboard that includes all keys that are normally found on a desktop computer, and as a result, the clamshell profile may be thicker.

Also, many laptops have adopted a "fanless" system for heat dissipation. Removing a mechanical fan from a system can save significant space, reduce the noise level, and make a laptop even lighter and more compact. A quieter environment can also improve productivity, and this is one of the reasons why many people prefer fanless laptops to those with fans. Accordingly, a premium laptop's clamshell must also provide space for a heat transfer unit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 7 shows a cross-sectional view of an exemplary lower compartment of a laptop with a standard keyboard according to another aspect of the present disclosure;

FIGS. 8 and 8A show cross-sectional views of an exemplary attachment member for a laptop according to an aspect of the present disclosure;

FIGS. 10 and 10A show top views of an exemplary thermal transfer unit according to an aspect of the present disclosure;

FIGS. 11A and 11B show an aspect of an exemplary thermal transfer unit according to the present disclosure;

FIGS. 12, 12A and 12B show cross-sectional views of an exemplary thermal transfer unit according to an aspect of the present disclosure;

FIGS. 13 and 13A show an aspect of an exemplary thermal transfer unit according to the present disclosure;

FIGS. 14, 14A and 14B show an exemplary thermal transfer unit according to an aspect of the present disclosure.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

Figure 1:
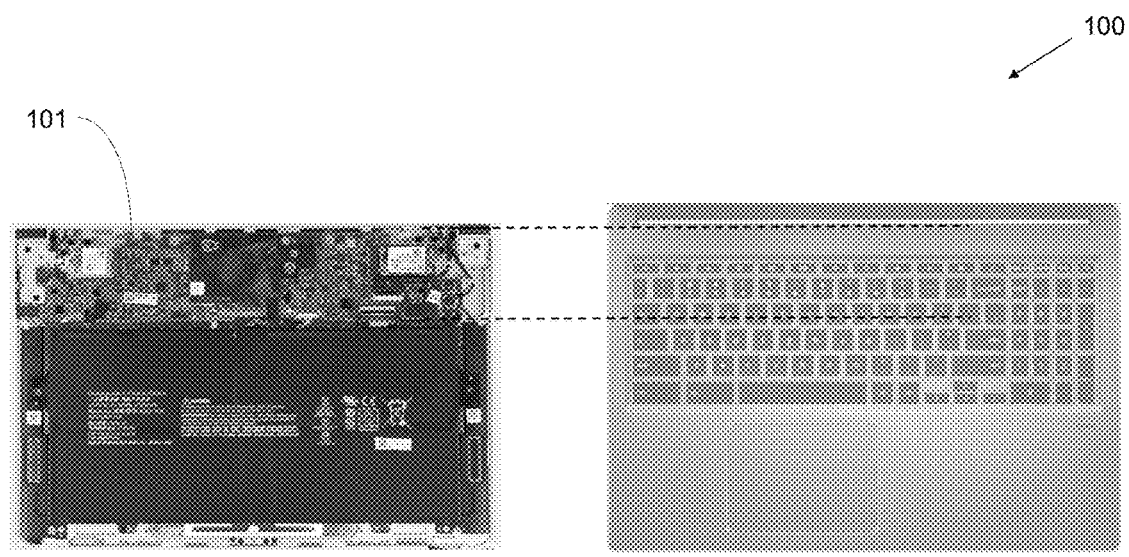
FIG. 1 shows an exemplary top view of a conventional laptop and the components in the lower compartment of its clamshell.

As shown in FIG. 1, a conventional laptop 100 may have the location of its motherboard 101 be overlapping with its keyboard position. Because of this overlap, conventional laptops may have a limit as to how much their thicknesses may be reduced.

Figure 2:
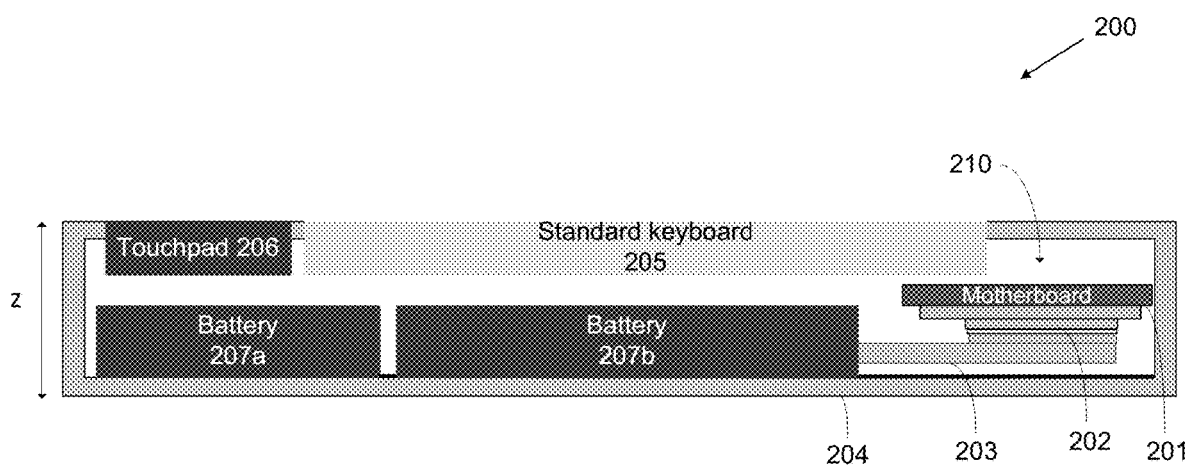
FIG. 2 shows a cross-sectional view of an exemplary lower compartment of a conventional laptop with a standard keyboard.

In FIG. 2, a cross-sectional view of an exemplary lower compartment of a conventional laptop 200 illustrates the relative thicknesses and positions of a motherboard 201, a semiconductor package with a die 202, and a thermal transfer unit 203, as well as other components, such as a standard keyboard 205, a touchpad 206, and batteries 207a and 207b, that may be positioned in a lower compartment 204 of a laptop's clamshell. A space 210 is unoccupied because of the overlap of the motherboard 201 and the keyboard 205. A z-height for such conventional laptops may be approximately 8.1 mm.

The motherboard 201, the semiconductor package with a die 202, and the thermal transfer unit 203 may have a total thickness of slightly greater than 3 mm. The state of the art motherboards may have a minimum width of approximately 25 mm and a typical semiconductor package will need approximately 18.5 mm of this width.

The standard keyboard 205 may have all the keys of a desktop computer keyboard, except for the number pad, and may have a thickness of approximately 3.0 mm. The touchpad 206 may have a thickness of approximately 2.5 mm. The batteries 207a and 207b may have a thickness of approximately 3.0 mm. It should be understood that there may be variations in these dimensions depending on the manufacturer of the components.

Figure 3:
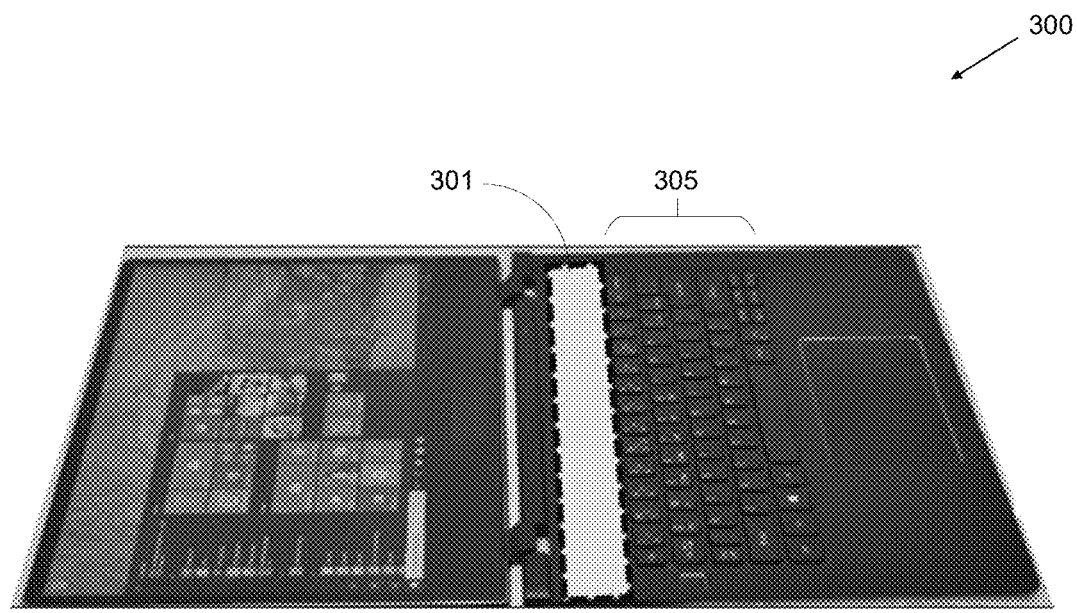
FIG. 3 shows an exemplary perspective top view of a conventional laptop with a non-standard keyboard.

FIG. 3 shows an exemplary perspective top view of a typical premium laptop 300 with a non-standard keyboard 305. A motherboard is shown as a footprint 301 at the laptop's "forehead" above the keyboard 305. The non-standard keyboard 305 is a narrower board, as it does not have a row of function keys, which may diminish a user's experience.

Figure 4:
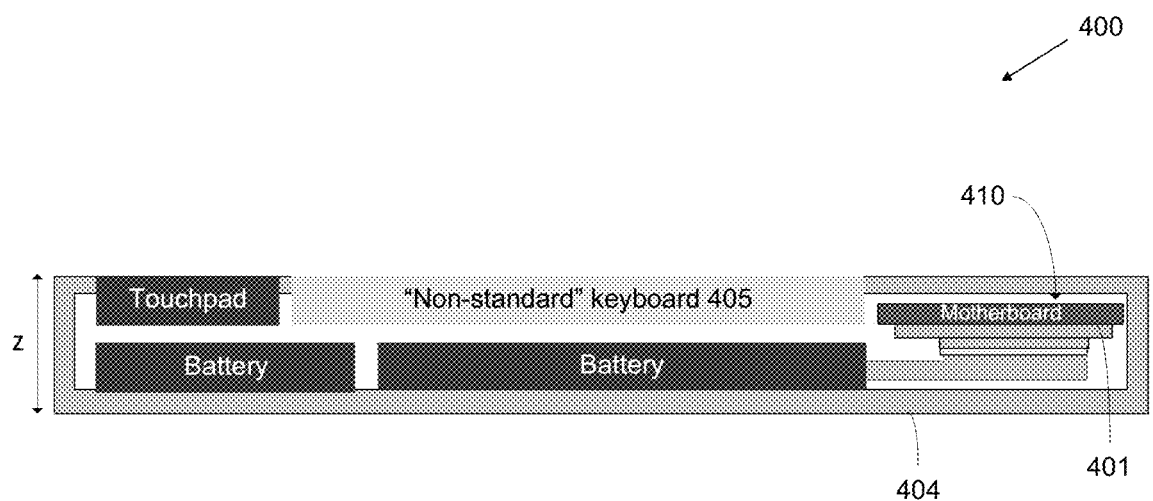
FIG. 4 shows a cross-sectional view of an exemplary lower compartment of a conventional laptop with a non-standard keyboard.

In FIG. 4, a cross-sectional view is shown of an exemplary lower compartment 404 of a typical premium laptop 400 with a non-standard keyboard 405. As shown, the narrower keyboard 405 allows a motherboard 401 to fit into a space 410. A z-height for such typical premium laptops may be approximately 6.5 mm.

According to the present disclosure, a laptop having a smaller thickness may be possible using a motherboard assembly including a motherboard having a plurality of components coupled thereon, a thermal transfer unit coupled to one or more component on the motherboard, and attachment members for holding the motherboard in a lower compartment of a laptop clamshell casing at an inclining position. The plurality of components may include a semiconductor package with a central processing unit (CPU).

The technical advantages of the present disclosure include, but are not limited to: (1) providing a laptop platform for z-height miniaturization through using empty space within a clamshell to achieve a less than 10 mm overall thickness without the need to reduce keyboard width; (2) improved CPU performance through an effective thermal solution; and (3) maintaining the users' experience by retaining a standard keyboard configuration for the laptop, i.e., keeping the function keys and keyboard travel distance.

Figure 5:
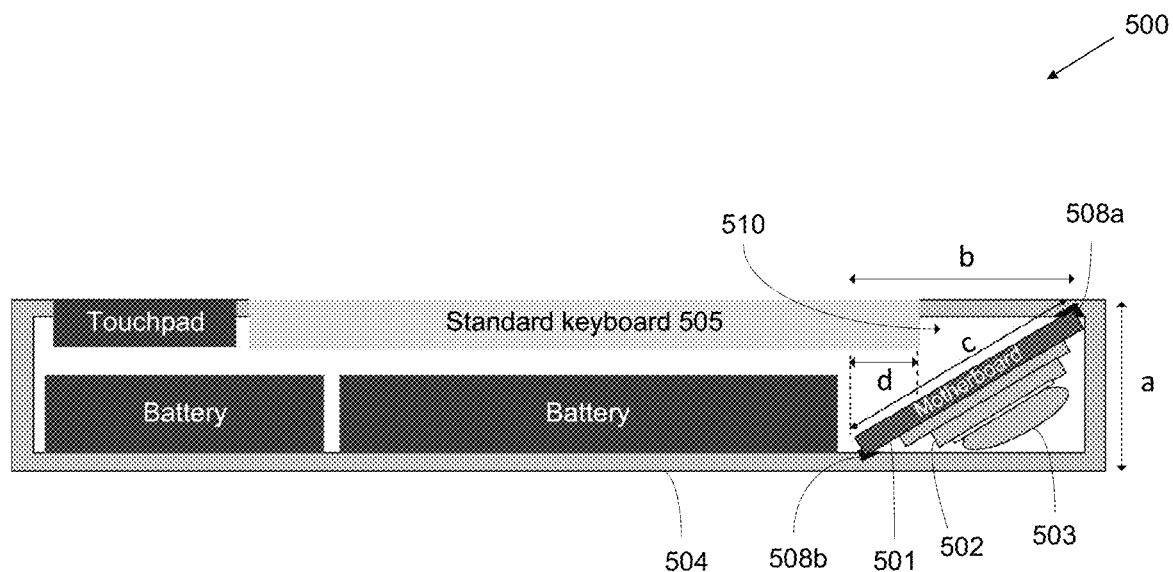
FIG. 5 shows a cross-sectional view of an exemplary lower compartment of a laptop with a standard keyboard according to an aspect of the present disclosure.

In an aspect of the present disclosure, as shown in FIG. 5, a cross-sectional view of an exemplary laptop 500 may have a lower compartment 504 with an inclined motherboard 501, which may be held in place by attachment members 508a and 508b, a semiconductor package 502 may be attached to the motherboard 501, a thermal transfer unit 503 may be attached to the semiconductor package 502, and provided with a standard keyboard 505. The inclined motherboard assembly may use the space 510.

In an aspect, the position of an inclined motherboard may be determined, in a given space in a lower compartment of a laptop, with the dimensions a, b, and c as shown in FIG. 5, using the Pythagorean theorem (i.e., $a^2+b^2=c^2$). By using the Pythagorean theorem, a designer may maximize the allowable motherboard width that may be placed into a laptop while keeping the same z-height or possibly reducing it. In another aspect, the angle of the incline for a motherboard may be in a range between 0 and 90 degrees, which may, in turn, determine the amount of overlap d between a motherboard and a standard keyboard. In an aspect, a motherboard may include a printed circuit board with width c in the range of 18.5 to 25 mm. It is within the scope of the present disclosure to use motherboards with a width wider than a 25 mm, provided an inclined position is maintained and a lower compartment may accommodate such a motherboard.

In another aspect, the thermal transfer unit 503 may provide one or more heat conductive tube that may be filled with a coolant. In yet another aspect, the thermal transfer unit may be a heat spreader.

In a further aspect, the attachment members 508a and 508b may include a slot in the lower compartment 504, a bracket with screws, or other fastening methods.

Figure 6:
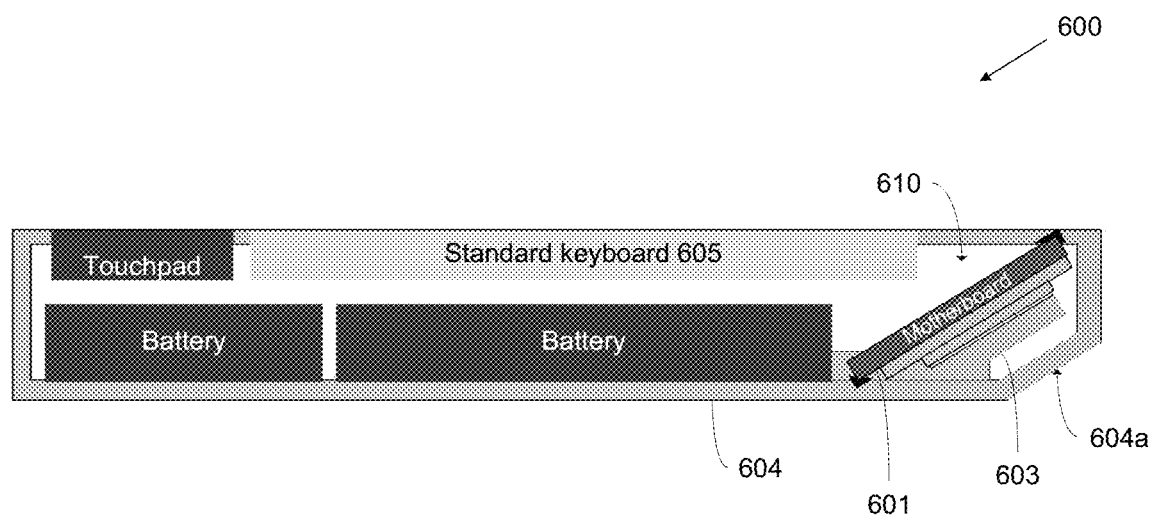
FIG. 6 shows a cross-sectional view of an exemplary lower compartment of a laptop with a standard keyboard according to another aspect of the present disclosure.

FIG. 6 shows a cross-sectional view of an exemplary lower compartment 604 of a laptop 600 with an inclined motherboard 601, including a thermal transfer unit 603 and a standard keyboard 605 according to another aspect of the present disclosure. In this aspect, the lower compartment 604 may have a beveled section 604a, which may be an additional design feature. The inclined motherboard assembly may use the space 610.

In another aspect, FIG. 7 shows a cross-sectional view of an exemplary lower compartment 704 of a laptop 700 with a more steeply inclined motherboard 701. The lower compartment 704 may have a hinge compartment 704b that may provide additional space for the motherboard.

FIGS. 8 and 8A show cross-sectional views of an exemplary attachment member 808 for a laptop 800 according to an aspect of the present disclosure. In this aspect, the attachment member 808 for a motherboard 801 may be a slot provided in an upper cover 804c of the lower compartment 804. Additional mechanical fasteners (not shown) may also be used to securely attach the motherboard assembly in the laptop 800.

Figure 9A:
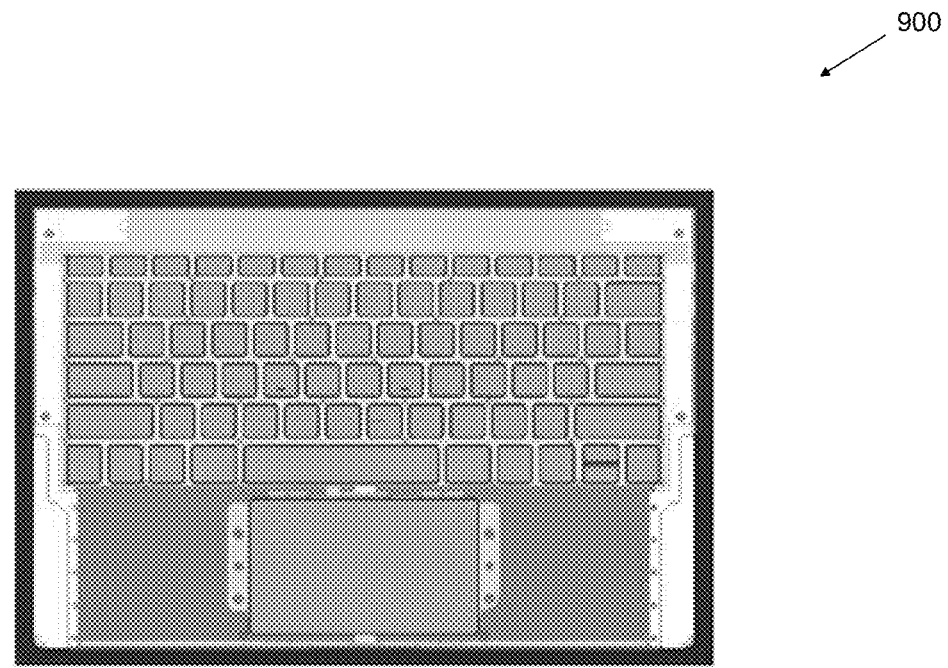
FIGS. 9A and 9B show an exemplary top view of a laptop with a standard keyboard and thermal transfer unit according to another aspect of the present disclosure.
Figure 9B:
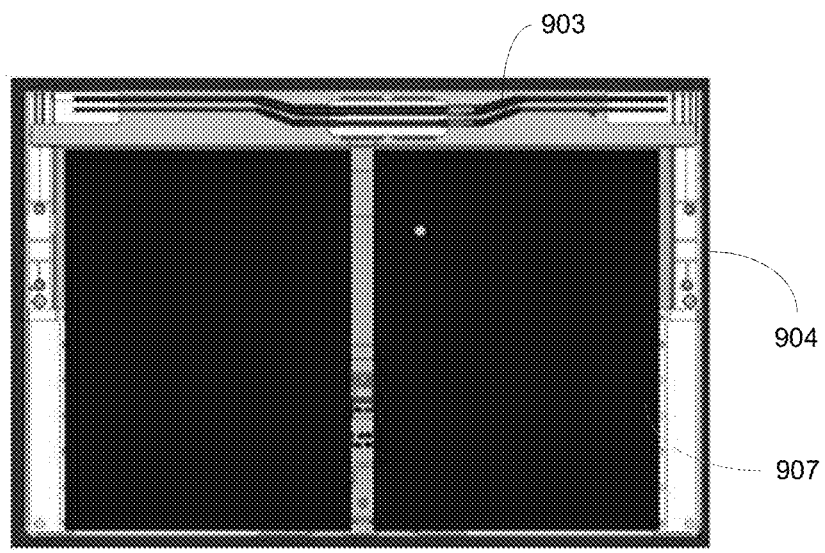

FIGS. 9A and 9B show exemplary views of a laptop 900 with a thermal transfer unit 903 according to another aspect of the present disclosure. FIG. 9B provides a bottom view of the lower compartment 904 with the thermal transfer unit 903 and a pair of batteries 907.

In FIGS. 10 and 10A, according to an aspect of the present disclosure for a device 1000, an exemplary thermal transfer unit 1003 coupled to a motherboard 1001 is shown. In FIG. 10, the thermal transfer unit 1003 includes two heat conductive tubes 1003a and 1003b, which may be filled with a coolant, and thermal spreader 1003c, which may be attached to semiconductor packages 1002. In an expanded view provided in FIG. 10A, the heat conductive tubes 1003a and 1003b may have a circular section 1003x, a transition section 1003y, and a flattened section 1003z.

In an aspect, the heat conductive tubes may be flattened at a heat source to maximize the contact surface therewith, and in a transition section, and the heat conductive tubes gradually become circular as more space becomes available. According to the present disclosure, using circular tubes may be feasible due to the additional clearance created by the inclined motherboard. It is understood that the maximum possible heat transfer ($Q_{max}$) is higher for partially circular and circular tubes.

FIGS. 11A and 11B show aspects of an exemplary thermal transfer unit according to the present disclosure. In these aspects, cross-sectional views of a laptop 1100 show circular sections of heat conductive tubes 1103a and 1103b.

In FIG. 12, another exemplary thermal transfer unit 12003 is shown according to an aspect of the present disclosure, and FIGS. 12A and 12B provide expanded cross-sectional views along an a-a' section line and a b-b' sectional line, respectively. FIG. 12A shows a flattened section of heat conductive tubes 1203a and 1203b and FIG. 12B shows a circular section of heat conductive tubes 1203a and 1203b.

FIGS. 13 and 13A show an aspect of an exemplary thermal transfer unit according to the present disclosure. In FIG. 13, a laptop 1300 with a lower compartment 1304 includes a thermal transfer unit 1303 that extends between batteries 1307. In the expanded view provided in FIG. 13A, a motherboard 1301 includes a cut-out section or opening 1301a for the thermal transfer unit 1303.

FIGS. 14, 14A, and 14B show an exemplary thermal transfer unit 1403 according to an aspect of the present disclosure. In FIG. 14, a motherboard 1401 includes a thermal transfer unit 1403, which may be coupled to a semiconductor package 1402, with an elongated or extended heat spreader 1403a. FIG. 14A provides a cross-sectional view of the motherboard 1401 and thermal transfer unit 1403 along an a-a' section line. FIG. 14B provides a cross-sectional view of the motherboard 1401 and the thermal transfer unit 1403, including the extended heat spreader 1403a, along a b-b' section line.

Figure 15:
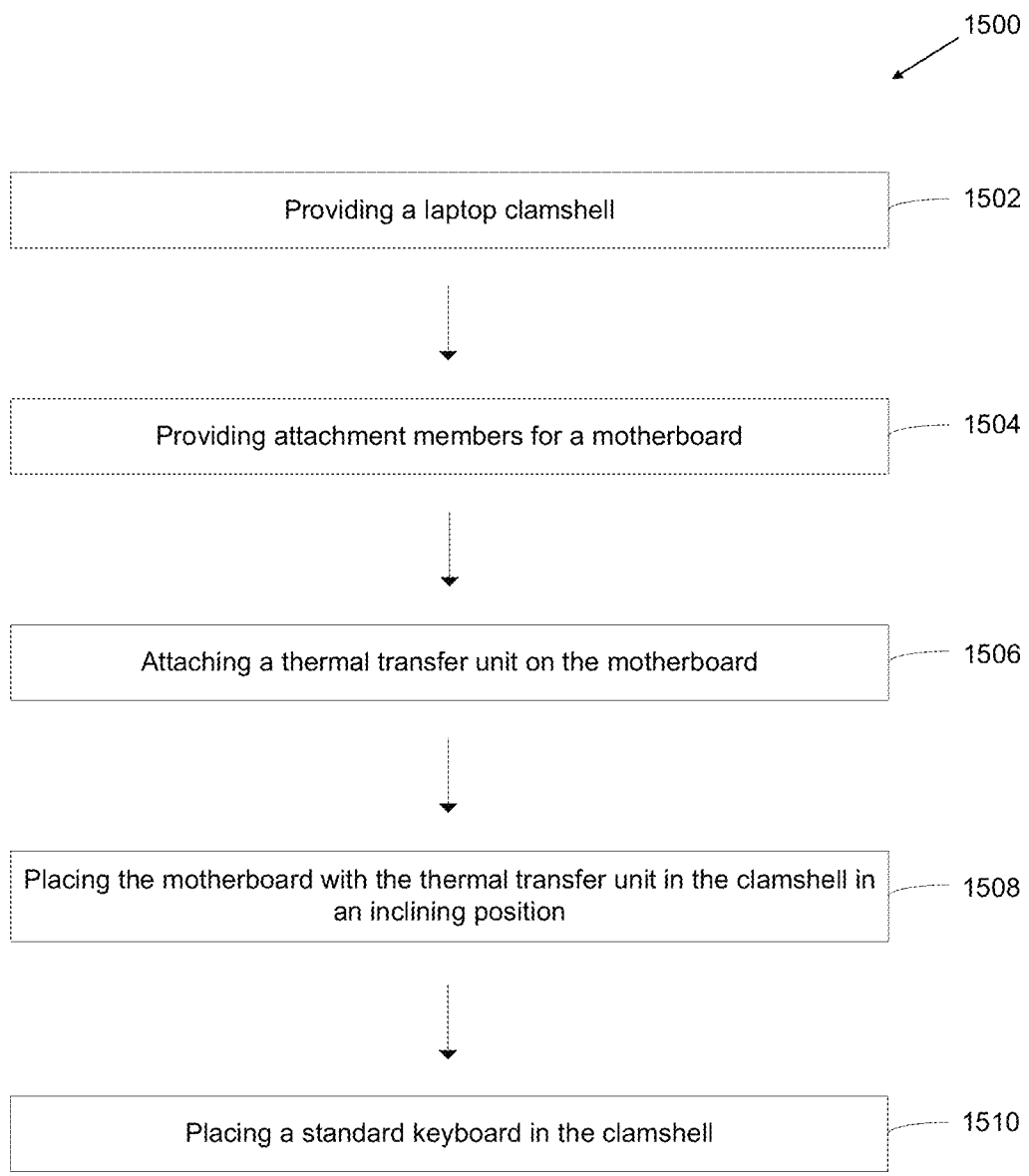
FIG. 15 shows a simplified flow diagram for an exemplary assembly method according to an aspect of the present disclosure.

FIG. 15 shows a simplified flow diagram for an exemplary method 1500 according to aspects of the present disclosure encompassing the assembly process.

The operation 1502 may be directed to providing a laptop clamshell.

The operation 1504 may be directed to providing attachment members for a motherboard.

The operation 1506 may be directed to attaching a thermal transfer unit on the motherboard.

The operation 1508 may be directed to placing the motherboard with the thermal transfer unit in the clamshell in an inclining position.

The operation 1510 may be directed to placing a standard keyboard in the clamshell.

To more readily understand and put into practical effect the present method and device for, particular aspects will now be described by way of examples. For the sake of brevity, duplicate descriptions of features and properties may be omitted.

EXAMPLES

Example 1 may include a motherboard assembly including a motherboard having a plurality of components coupled thereon, a thermal transfer unit coupled to one or more component on the motherboard, and attachment members for holding the motherboard in a lower compartment of a laptop clamshell casing at an inclining position.

Example 2 may include the motherboard assembly of example 1 and/or any other example disclosed herein, in which the thermal transfer unit further includes at least one heat conductive tube.

Example 3 may include the motherboard assembly of example 2 and/or any other example disclosed herein, in which the heat conductive tube further includes a flattened section, a transition section, and a circular section.

Example 4 may include the motherboard assembly of example 1 and/or any other example disclosed herein, in which the thermal transfer unit further includes a heat spreader.

Example 5 may include the motherboard assembly of example 4 and/or any other example disclosed herein, in which the heat spreader further includes an elongated section, and in which the motherboard further includes an opening for accommodating the elongated section of the heat spreader.

Example 6 may include the motherboard assembly of example 1 and/or any other example disclosed herein, in which the motherboard further includes a board width in the range of 18.5 to 25 mm.

Example 7 may include a laptop having a clamshell casing with upper and lower compartments, a motherboard positioned in the lower compartment, the motherboard including a plurality of components coupled thereon, a thermal transfer unit coupled to one or more component on the motherboard, attachment members for holding the motherboard at an inclining position, and a keyboard in the lower compartment in a horizontal position.

Example 8 may include the laptop of example 7 and/or any other example disclosed herein, in which the keyboard is a standard size keyboard.

Example 9 may include the laptop of example 7 and/or any other example disclosed herein, in which the keyboard is partially overlapping the inclined motherboard.

Example 10 may include the laptop of example 7 and/or any other example disclosed herein, in which the lower compartment further includes a hinge compartment, in which the motherboard positioned in the inclining position partially extends into the hinge compartment.

Example 11 may include the laptop of example 7 and/or any other example disclosed herein, in which the thermal transfer unit further includes at least one heat conductive tube.

Example 12 may include the laptop of example 11 and/or any other example disclosed herein, in which the heat conductive tube further includes a flattened section, a transition section, and a circular section.

Example 13 may include the laptop of example 7 and/or any other example disclosed herein, in which the thermal transfer unit further includes a heat spreader.

Example 14 may include the laptop of example 13 and/or any other example disclosed herein, in which the heat spreader further includes an elongate section, and in which the motherboard further includes an opening for accommodating the elongate section of the heat spreader.

Example 15 may include the laptop of example 14 and/or any other example disclosed herein, further includes two batteries positioned in the lower compartment and the elongated section of the heat spreader is positioned between the two batteries.

Example 16 may include the laptop of example 7 and/or any other example disclosed herein, in which the motherboard further includes a printed laptop with width in the range of 18.5 to 25 mm.

Example 17 may include the laptop of example 7 and/or any other example disclosed herein, further includes the motherboard with an angle of incline in the range of 10 to 85 degrees.

Example 18 may include the laptop of example 7 and/or any other example disclosed herein, in which The laptop of claim 7, in which the lower compartment of the clamshell casing further includes a thickness of 6.5 mm or less.

Example 19 may include a method including providing a laptop clamshell including an upper and lower compartment, providing attachment members on the lower compartment for holding a motherboard, placing the motherboard in the lower compartment in an inclining position, and placing a keyboard in the lower compartment in a horizontal position.

Example 20 may include the method of example 19 and/or any other example disclosed herein, in which the motherboard has a plurality of component coupled thereon, the method further including coupling a thermal transfer unit to at least one or more components on the motherboard.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled, as thermally coupled, and/or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A motherboard assembly comprising:
    a motherboard comprising a plurality of components coupled thereon;
    a thermal transfer unit coupled to one or more component on the motherboard; and
    attachment members for holding the motherboard in a lower compartment of a laptop clamshell casing at an inclining position;
    wherein the thermal transfer unit further comprises a heat spreader;
    wherein the heat spreader further comprises an elongated section; and
    wherein the motherboard further comprises an opening for accommodating the elongated section of the heat spreader.

2. The motherboard assembly of claim 1, wherein the thermal transfer unit further comprises at least one heat conductive tube.

3. The motherboard assembly of claim 2, wherein the heat conductive tube further comprises a flattened section, a transition section, and a circular section.

4. The motherboard assembly of claim 1, wherein the motherboard further comprises a board width in the range of 18.5 to 25 mm.

5. A laptop comprising:
    a clamshell casing comprising upper and lower compartments;
    a motherboard positioned in the lower compartment, the motherboard comprising a plurality of components coupled thereon;
    a thermal transfer unit coupled to one or more component on the motherboard;
    attachment members for holding the motherboard at an inclining position; and
    a keyboard in the lower compartment in a horizontal position;
    wherein the thermal transfer unit further comprises a heat spreader;
    wherein the heat spreader further comprises an elongated section; and
    wherein the motherboard further comprises an opening for accommodating the elongated section of the heat spreader.

6. The laptop of claim 5, wherein the keyboard is a standard size keyboard.

7. The laptop of claim 5, wherein the keyboard is partially overlapping the inclined motherboard.

8. The laptop of claim 5, wherein the lower compartment further comprises a hinge compartment, wherein the motherboard positioned in the inclining position partially extends into the hinge compartment.

9. The laptop of claim 5, wherein the thermal transfer unit further comprises at least one heat conductive tube.

10. The laptop of claim 9, wherein the heat conductive tube further comprises a flattened section, a transition section, and a circular section.

11. The laptop of claim 5, further comprising two batteries positioned in the lower compartment, and the elongated section of the heat spreader is positioned between the two batteries.

12. The laptop of claim 5, wherein the motherboard further comprises a printed circuit board with width in the range of 18.5 to 25 mm.

13. The laptop of claim 5, further comprises the motherboard with an angle of incline in the range of 0 to 90 degrees.

14. The laptop of claim 5, wherein the lower compartment of the clamshell casing further comprises a thickness of 6.5 mm or less.

15. A method comprising:
    providing a laptop clamshell comprising an upper and lower compartment;
    providing attachment members on the lower compartment for holding a motherboard;
    placing the motherboard in the lower compartment in an inclining position; and
    placing a keyboard in the lower compartment in a horizontal position; and
    coupling a thermal transfer unit to at least one or more components on the motherboard;
    wherein the thermal transfer unit further comprises a heat spreader;
    wherein the heat spreader further comprises an elongated section; and
    wherein the motherboard further comprises an opening for accommodating the elongated section of the heat spreader.

* * * * *